United States Patent
Schat (10) Patent No.: US 11,557,365 B2
(45) Date of Patent: Jan. 17, 2023

(54) COMBINED ECC AND TRANSPARENT MEMORY TEST FOR MEMORY FAULT DETECTION

(71) Applicant: NXP B.V., Eindhoven (NL)

(72) Inventor: Jan-Peter Schat, Hamburg (DE)

(73) Assignee: NXP B.V., Eindhoven (NL)

(*) Notice: Subject to any disclaimer, the term of this patent is extended or adjusted under 35 U.S.C. 154(b) by 190 days.

(21) Appl. No.: 16/542,776

(22) Filed: Aug. 16, 2019

(65) Prior Publication Data
US 2021/0050068 A1    Feb. 18, 2021

(51) Int. Cl.
| | | |
|---|---|---|
| *G11C 29/42* | (2006.01) | |
| *G11C 29/52* | (2006.01) | |
| *G06F 11/10* | (2006.01) | |
| *G11C 11/4096* | (2006.01) | |
| *G11C 29/56* | (2006.01) | |
| *G11C 29/44* | (2006.01) | |
| *G11C 29/10* | (2006.01) | |
| *G11C 29/12* | (2006.01) | |

(52) U.S. Cl.
CPC .......... *G11C 29/42* (2013.01); *G06F 11/1068* (2013.01); *G11C 29/52* (2013.01); *G11C 11/4096* (2013.01); *G11C 29/10* (2013.01); *G11C 29/12* (2013.01); *G11C 29/44* (2013.01); *G11C 2029/5602* (2013.01)

(58) Field of Classification Search
CPC ......... G11C 29/52; G11C 29/42; G11C 29/44; G11C 11/4096; G11C 2029/5602; G11C 29/10; G11C 29/12; G06F 11/1068
See application file for complete search history.

(56) References Cited

U.S. PATENT DOCUMENTS

| 5,469,445 A | 11/1995 | Nicolaidis |
| 6,216,251 B1 * | 4/2001 | McGinn .............. G06F 11/1032 714/E11.047 |
| 9,583,216 B2 | 2/2017 | Jones et al. |

(Continued)

OTHER PUBLICATIONS

Nicolaidis, "Theory Of Transparent BIST For RAMs", IEEE Transactions On Computers, vol. 45, No. 10, 16 pgs. (Oct. 1996).

(Continued)

*Primary Examiner* — April Y Blair
*Assistant Examiner* — Sazzad Hossain (57) ABSTRACT

Embodiments combine error correction code (ECC) and transparent memory built-in self-test (TMBIST) for memory fault detection and correction. An ECC encoder receives input data and provides ECC data for data words stored in memory. Input XOR circuits receive the input data and output XOR'ed data as payload data for the data words. Output XOR circuits receive the payload data and output XOR'ed data. An ECC decoder receives the ECC data and the XOR'ed output data and generates error messages. Either test data from a controller running a TMBIST process or application data from a processor executing an application is selected as the input data. Either test address/control signals from the controller or application address/control signals from the processor are selected for memory access. During active operation of the application, memory access is provided to the processor and the controller, and the memory is tested during the active operation.

24 Claims, 6 Drawing Sheets

(56) References Cited

U.S. PATENT DOCUMENTS

| | | | | |
|---|---|---|---|---|
| 2003/0105999 A1* | 6/2003 | Koss | ................ | G11C 29/38 714/718 |
| 2003/0169634 A1* | 9/2003 | Kilmer | ................ | G11C 11/406 365/222 |
| 2005/0044467 A1* | 2/2005 | Leung | ................ | G06F 11/1048 714/763 |
| 2005/0204232 A1* | 9/2005 | Seuring | ................ | G11C 29/32 714/733 |
| 2014/0095947 A1* | 4/2014 | Mozak | ................ | G11C 29/08 714/718 |
| 2017/0068607 A1* | 3/2017 | Herzi | ................ | G06F 13/24 |

OTHER PUBLICATIONS

Grigoryan et al., "Advanced ECC-Based FIT Rate Mitigation Technique For Automotive SoCs", International Test Conference, IEEE, 6 pgs. (2018).

Nicolaidis, "Transparent BIST For ECC-Based Memory Repair", IEEE, 8 pgs. (2013).

Thaller et al., "A Transparent Online Memory Test For Simultaneous Detection Of Functional Faults And Soft Errors In Memories", IEEE Transactions On Reliability, vol. 52, No. 4, 10 pgs. (Dec. 2003).

Schroeder et al., "DRAM Errors In The Wild: A Large-Scale Field Study", Sigmetrics Performance, 12 pgs. (Jun. 2009).

Hwang et al., "Cosmic Rays Don't Strike Twice: Understanding The Nature Of DRAM Errors And The Implications For System Design", ASPLOS, 12 pgs. (Mar. 2012).

Schroeder et al., "Flash Reliability In Production: The Expected And The Unexpected", The Advanced Computing Systems Association, Proceedings Of The 14th USENIX Conference, 15 pgs. (Feb. 2016).

Sridharan et al., "Feng Shui Of Supercomputer Memory", SC13, 11 pgs. (Nov. 2013).

Kumar et al., "Impact Of NBTI On SRAM Read Stability And Design For Reliability", Proceedings Of The 7th International Symposium On Quality Electronic Design, 6 pgs. (2006).

* cited by examiner

COMBINED ECC AND TRANSPARENT MEMORY TEST FOR MEMORY FAULT DETECTION

TECHNICAL FIELD

This technical field relates to memory fault detection.

BACKGROUND

Due to their high package density, memories are especially vulnerable to hard defects including single event upsets and faults due to parametric variations. Functional safety requirements for many environments mandate device solutions cope with any such faults within a short time interval, thus requiring the memory to be monitored during application mode. Using error correction codes (ECC) in conjunction with memory scrubbing and bit spreading in regular time intervals is a standard solution for this problem. This technique, however, does not write or modify memory data. As such, there is a risk that faults in inactive memory areas accumulate and lead to uncorrectable multi-bit faults within a data word.

ECC algorithms are standard mechanisms to cope with transient and permanent faults in memories. Cyclic redundancy codes (CRC) is a common ECC algorithm that adds additional bits (e.g., 8 bits of CRC) to each data word (e.g., 64 bits of data) to provide single-bit-error correction and dual-bit-error detection for a memory. ECC algorithms are also used in part to correct permanent faults that are detected in production test. This use of ECC algorithms in production increases yield; however, the correction and detection capability of the post-production ECC algorithms is then not completely accessible to correct errors occurring during operation in the field.

Memory scrubbing, which refers to scanning all of the memory contents in regular time intervals, in combination with ECC is used to detect and correct faults, especially soft errors. Memory scrubbing is often used to prevent the accumulation of single, correctable errors that ultimately lead to uncorrectable multi-bit errors within a data word. Scrubbing rates vary widely depending upon memory sizes and solutions from scanning the whole memory about every 10 seconds, to every 45 minutes, to once a day or more.

Bit spreading of logically adjacent cells is another common technique. Because single event upsets often disturb geometrically neighboring memory cells, bit spreading is used to spread geometrically neighboring memory cells to different memory words. Thus, multiple faults in geometrically neighboring cells lead to correctable single-bit errors in different data words instead of uncorrectable multi-bit errors in one data word.

Current ECC solutions with memory scrubbing and bit spreading, however, may be insufficient for some current and projected future needs for high-safety applications. For example, error rates due to soft and hard errors (as expected from process data, lifetime calculations, and accelerated aging experiments) are often much higher than allowed for many safety-critical applications. In addition, the fraction of hard errors (referred to as the total number of errors) seen in the field are likely to be higher than expected from process data, lifetime calculations, and accelerated aging experiments. It has also been found that the fraction of uncorrectable multi-bit errors with respect to all hard errors seen in the field is also likely to be higher than expected from process data, lifetime calculations, and accelerated aging experiments. Further, inactive regions of memories, such as static random access memories (SRAMs) that are often used in small technology nodes, are severely affected by negative bias temperature instability (NBTI) unless the bits are flipped in regular intervals. Bit-flipping circuitry, however, adds complexity and cost to these solutions. Similar to NBTI, positive bias temperature instability (PBTI) is also a relevant concern in very small processes, for example, below 28 nanometers (nm) processes. While NBTI affects PMOS transistors, PBTI affects NMOS transistors. Together, NBTI and PBTI are typically referred to as bias temperature instability (BTI).

In smaller technology nodes, the fault rate is also expected to rise due to increased aging and reduction of supply voltage and hence reduced noise margin. This increase in expected fault rates causes the need for additional built-in self-test circuitry (BIST) to detect such accumulation of faults. Using these BIST techniques, warnings can be generated and counter-measures can be initiated before undetectable multi-bit faults lead to a system failure. As such, some prior memories have included memory built-in self-test (MBIST) that is executed in the field at regular time intervals to generate memory failure warnings. For a memory test that is performed intermittent to operational modes, transparent memory BIST (TMBIST) can be used. Further, TMBIST can include successive exclusive-OR (XOR) operations that are applied to maintain memory contents instead of overwriting the memory with a separate fixed pattern.

Figure 1A:
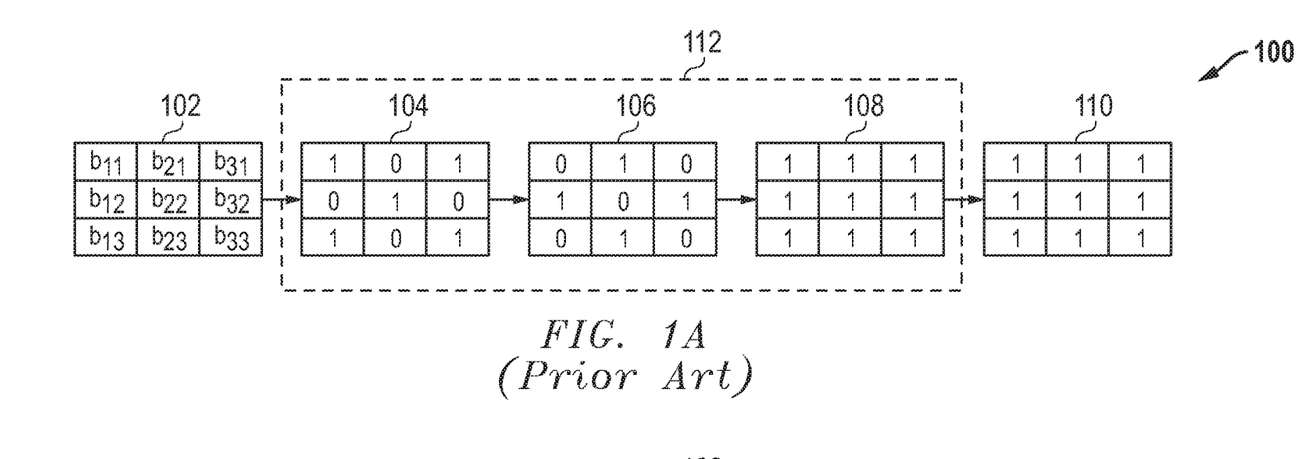
FIG. 1A (Prior Art) provides an example embodiment for a standard, non-transparent MBIST process with respect to example memory cells.

FIG. 1A (Prior Art) provides an example embodiment 100 for a standard, non-transparent MBIST process with respect to example memory cells. For embodiment 100, nine (9) adjacent memory cells are shown. The memory cells have an initial state 102 and are designated b11, b12, b13, b21, b22, b23, b31, b32, and b33. It is also noted that the "xy" numbers in the "bxy" designations used herein represent row and column numbers for the location of the cell in a cell array that makes up the memory. During the MBIST process, the memory cells are overwritten in different marches 112 by various background patterns. For the example shown, a checkerboard pattern of 1s and 0s is written to the memory cells in a first march 104. Next, in s second march 106, an inverse checkerboard pattern of 0s and is written to the memory cells. In the last march 108, an all-1 background pattern is written to the cells. During these marches 112, the particular patterns are successively written to and read out of the memory cells. After the MBIST process, the final state 110 of the memory cells includes the last pattern written or all 1s in the example embodiment 100. Thus, this memory test technique destroys the original contents of the memory. It is further noted that for a positive logic implementation, a "1" represents a high voltage logic level and a "0" as used herein represents a low voltage logic level. For a negative logic implementation, a "1" represents a low voltage logic level and a "0" represents a low voltage logic level. Either positive logic implementations or negative logic implementations can be used with respect to the techniques described herein.

Figure 1B:
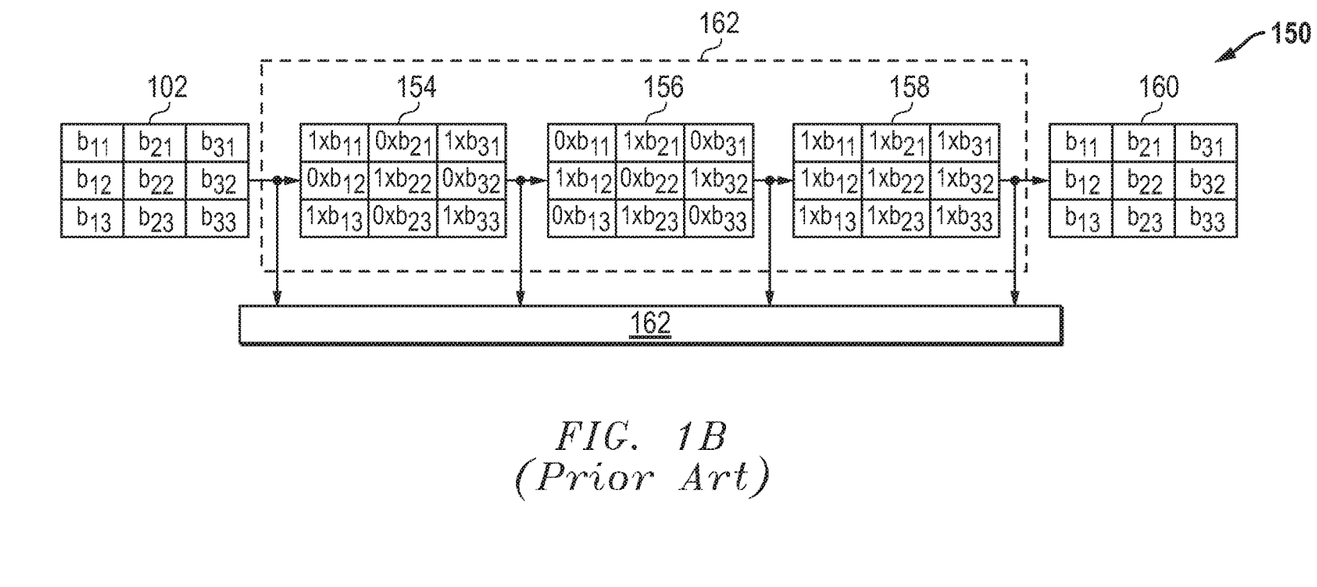
FIG. 1B (Prior Art) provides an example embodiment for a TMBIST process with respect to example memory cells.

FIG. 1B (Prior Art) provides an example embodiment 150 for a TMBIST process with respect to example memory cells. For embodiment 150, nine (9) adjacent memory cells are again shown. As above, the memory cells are designated as b11, b12, b13, b21, b22, b23, b31, b32, and b33 and have an initial state 102. In contrast with the MBIST process, the TMBIST process reads and processes memory contents through successive bit-wise XOR operations with a background pattern and results are written back to the cell. For example, in a first march 154, the memory cell contents are XOR'ed with a checkerboard pattern of 1s and 0s as represented by the "x" between the 1s and 0s and memory contents. The result of the XOR operation is written to each cell. Next, in a second march 156, an inverse checkerboard pattern of 0s and 1s is XOR'ed with the contents of the memory cells. The "x" again represents the XOR operation, and the result of the XOR operation is written to each cell. In the last march 158, an all-1 background pattern is XOR'ed with the contents of the memory cells. The "x" again represents the XOR operation, and the result of the XOR operation is written to each cell. After finishing all marches of a TMBIST run, each memory cell has been inverted an even number of times and is therefore restored to its original state as represented by the final state 160. Before and during these marches 162, the contents of the memory cells can be read out and subjected to error checking, such as through an ECC decoder 162. This TMBIST technique is advantageous in cases where the memory needs to be tested concurrently or intermittent to an application mode, and TMBIST has been shown to achieve at least the same test coverage as a standard MBIST. This prior art TMBIST process, however, still changes the contents of the memory cells and causes concurrent testing to interfere with active application modes.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Embodiments are disclosed that combine ECC and transparent memory tests for memory fault detection. The disclosed embodiments combine TMBIST and ECC with memory scrubbing to achieve improved memory fault detection and correction that occurs concurrently with active application modes. Each read access of the memory is followed by an XOR operation as part of a TMBIST process. Two status bits for each data word are used to store the information about which bits have been XOR'ed, or these status bits are generated when a data word is accessed. As such, a data word modified by the TMBIST process can be corrected in case it is read out or overwritten by a concurrently running application. Further, unlike the prior solutions, TMBIST and ECC with memory scrubbing as described herein are all executed in parallel or quasi-parallel and concurrently to the application. As both the application and the TMBIST process can access the memory, additional techniques described below are used to prioritize access and to ensure that the application and the TMBIST do not disturb each other. In operation, disclosed embodiments provide advantages of ECC and TMBIST with minimal area and timing overhead. A variety of additional or different features and variations can also be implemented.

Figure 2:
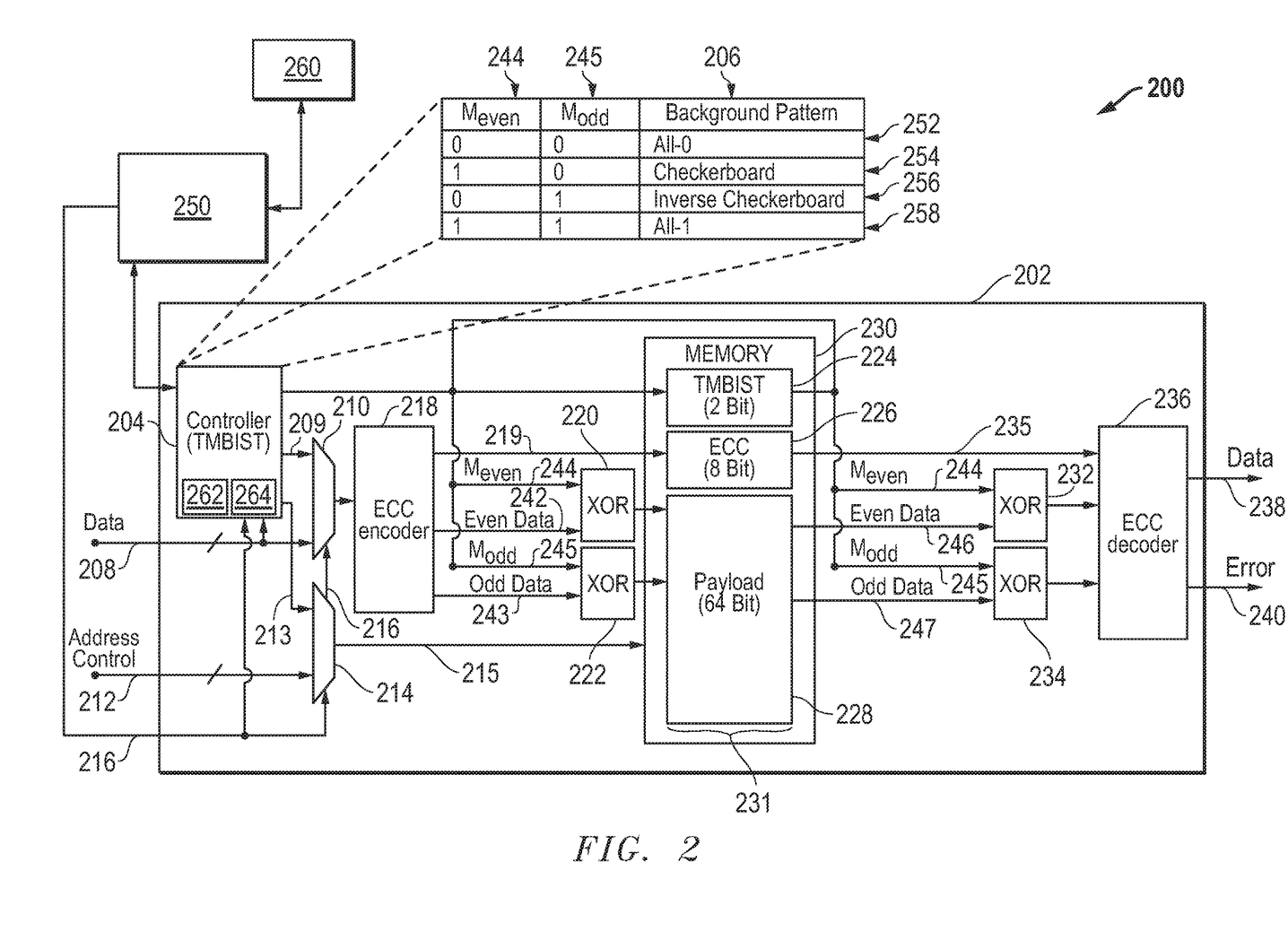
FIG. 2 is a block diagram of an example embodiment for an integrated circuit including a memory system that combines TMBIST and ECC with memory scrubbing to achieve improved memory fault detection and correction.

FIG. 2 is a block diagram of an example embodiment for an integrated circuit 200 including a memory system 202 that combines TMBIST and ECC with memory scrubbing to achieve improved memory fault detection and correction. The integrated circuit 200 in part includes a processor 250 and a memory system 202. The processor 250 executes an application 260 that accesses the memory 230. The application 260, for example, can be program instructions stored in a non-transitory data storage medium that when executed by the processor 250 cause the application functions to be performed. The application functions include reads from and writes to the memory 230. The memory 230 within the memory system 202 includes memory cells that each store a bit of data (e.g., 1-high voltage logic level, 0-low voltage logic level). The data is organized in data words 231, and the memory 230 stores a plurality of words 231. Each data word 231 includes a payload data 228 (e.g., 64 bits) and ECC data 226 (e.g., 8 bits). For one embodiment, each data word 231 also includes TMBIST data 224 (e.g., 2 bits). As described further below, the TMBIST data can include an even bit ($M_{even}$) 244 and odd bit ($M_{odd}$) 245. The even bit ($M_{even}$) 244 is used in XOR operations for cells in the memory 230 where the row and column numbers for the cell location add up to an even number. The odd bit ($M_{odd}$) 245 is used in XOR operations for cells in the memory where the row and address column numbers for the cell location add up to an odd number. For other embodiments as described below, data words 231 do not include the TMBIST data 224, and the controller 204 determines the even bit ($M_{even}$) 244 and odd bit ($M_{odd}$) 245 when each data word 231 is accessed.

During operation, the memory 230 can be accessed by a processor 250 for normal application mode operations and can be accessed by the controller 204 for TMBIST operations as described herein. The controller 204 in part includes an address counter 262 and a march counter 264. Application data 208 to be written to memory 230 is provided to multiplexer 210. Multiplexer 210 also receives test data 209 from controller 204. The application data 208 and the test data 209 provide the payload data 228 for memory writes to data words 231 within the memory 230. Application address and control signals 212 associated with memory accesses (e.g., writes or reads) by an application are provided to multiplexer 214. Multiplexer 214 also receives test address and control signals 213 associated with memory accesses (e.g., writes or reads) for TMBIST operations from controller 204. The processor 250 provides control signals 216 to multiplexers 210 and 214 to select application data/address/control signals 208/212 or to select test data/address/control signals 209/213. The selected test data 209 or application data 208 is output to the ECC encoder 218, and the selected test address/control signals 213 or application address/control signals 212 is output to the memory 230. The memory 230 includes internal control circuits that use the test or application address/control signals 212/213 to select the data word 231 to access using the address signals and to determine the operation to perform (e.g., read, write) on the accessed data word 231 using the control signals.

The ECC encoder 218 receives the data output from multiplexer 210. As indicated above, this data output provides the payload data 228 for a data word 231 within memory 230. The ECC encoder 218 generates the ECC data 226 for the data word 231 using one or more ECC algorithms. For example, the ECC encoder 218 processes the bits within a data word 231 and generates a code, such as an 8-bit code, that represents the payload data 228 within the data word 231. As described below, the ECC decoder 236 uses the same ECC algorithm(s) to generate a check code that is compared to the ECC data 226 to detect and/or correct errors within the data word 231. The ECC encoder 218 provides the ECC data 226 to the memory 230 through output 219, and the ECC encoder 218 provides even cell data 242 and odd cell data 243 for the payload data 228 to input XOR circuits 220 and 222, respectively. The XOR circuit 220 also receives the even bit ($M_{even}$) 244 for XOR operations from the TMBIST controller 204, and the XOR circuit 222 also receives the odd bit ($M_{odd}$) 245 for XOR operations from the TMBIST controller 204. The input XOR circuits 220/222 perform an XOR operation on the inputs and provides outputs to the even cells and odd cells within memory 230, respectively.

For data read from the memory 230, even cell data 246 for the payload 228 is provided to XOR circuit 232, and odd cell data 247 for the payload 228 is provided to XOR circuit 234. The output XOR circuits 232 and 234 also receive the even bit ($M_{even}$) 244 and the odd bit ($M_{odd}$) 245 from the TMBIST controller 204. The output of the XOR circuits 232/234 is provided to ECC decoder 236, and the ECC decoder 236 outputs this XOR data as output data 238 for the data word 231 being read. The ECC decoder 236 also receives the ECC data 226 from the memory 230 through an output 235. The ECC decoder 236 generates a check code using the same ECC algorithm(s) used by the ECC encoder 218. If the check code matches the ECC data 226, then no error is indicated. If the check code does not match the ECC data 226, then an error is detected and an error message 240 is generated and output to another circuit such as the processor 250. For example, The ECC decoder 236 can output warnings in case of correctable errors and error messages in case of uncorrectable errors. Different or additional error messages can also be output.

The XOR operations performed by the XOR circuits 220/222/232/234 provide the following outputs with respect to two inputs (A, B) as shown in the XOR truth table below. To simplify the discussions below, the A input is assumed to be the even bit ($M_{even}$) 244 or the odd bit ($M_{odd}$) 245, and the B input is assumed to be the even cell data 242/246 or odd cell data 243/247.

TABLE

XOR Truth Table

| Input | | Output |
|---|---|---|
| A | B | |
| 0 | 0 | 0 |
| 0 | 1 | 1 |
| 1 | 0 | 1 |
| 1 | 1 | 0 |

As described herein, the TMBIST controller 204 performs a memory test using multiple kinds of marches and related data patterns. For the example embodiment in FIG. 2, the marches 206 are used. For a first kind of march 252, an all-0 pattern is used with the even bit ($M_{even}$) 244 set to 0 and the odd bit ($M_{odd}$) 245 set to 0. For a second kind of march 254, a checkerboard pattern is used with the even bit ($M_{even}$) 244 set to 1 and the odd bit ($M_{odd}$) 245 set to 0. For a third kind of march 256, an inverse checkerboard pattern is used with the even bit ($M_{even}$) 244 set to 0 and the odd bit ($M_{odd}$) 245 set to 1. For the last kind of march 258, an all-1 pattern is used with the even bit ($M_{even}$) 244 set to 1 and the odd bit ($M_{odd}$) 245 set to 1. For each of the marches 206, all of the memory 230 is accessed one data word 231 at a time, and XOR operations are performed on the bits within these data words 231 by XOR circuits 220/222/232/234.

It is noted that different numbers and types of marches could also be used as long as the marches 206 selected for the TMBIST operation along with the XOR operations leave the final state of the data within the cells for memory 230 matching the initial state of the data within the cells for memory 230. It is also noted that the memory addresses for TMBIST operations provided by the controller 204 to memory 230 through signals 213 and multiplexer 214 may be either continuously incremented or continuously decremented by 1. Although incrementing-by-1 and decrementing-by-1 are useful techniques to travel through the whole range of addresses, other techniques of going through the whole range of addresses may also be applied to detect all modelled defects or faults. In these cases, each address will be used exactly once in the respective march. As such, each of the marches 206 through the whole memory 230 is either an upward march with increasing addresses or a downward march with decreasing addresses.

As indicated above, the control signals 216 from the processor 250 control the selections made by the multiplexers 210 and 214. The address and control signals 212/213 can include the memory address for the data word 231 being accessed in the memory 230 and also include control signals such as read commands, write commands, chip-enable commands, or other memory control signals. For read access without significant time loss, the only delay introduced is due to the multiplexers 210/214 that select between TMBIST test signals 209/213 and the application signals 208/212. For write access, the even bit ($M_{even}$) 244 and the odd bit ($M_{odd}$) 245 are first read for the data word 231 being accessed, for example, under control of the processor 250. These bits 244/245 are then used for the XOR operations by XOR circuits 220/222 on the bits for the data word 231 to be written to the memory 230. As such, the write access takes more time than the read access. It is further noted that for one embodiment described further below, the even bit ($M_{even}$) 244 and the odd bit ($M_{odd}$) 245 are determined by the controller 204 rather than being stored in and read from the data word 231.

It is noted that processor 250 can be a microcontroller, a microprocessor, a programmable logic device, or other programmable circuit that executes program instructions stored in a non-volatile data storage device to carry out the functions described herein. It is further noted that that controller 204 can also be implemented as a dedicated logic circuit, dedicated controller, or other hardware digital solution that implements the control actions and functions described herein. The controller 204 can also be implemented as a microcontroller, a microprocessor, a programmable logic device, or other programmable circuit that executes program instructions stored in a non-volatile data storage device to carry out the control actions and functions described herein. Other variations can also be implemented.

Benefits provided by the disclosed embodiments include reduced requirements for chip area, power, and latency along with synergies of enhanced fault detection. Any correctable error or uncorrectable error found by the ECC decoder 236 leads to warnings or error indications through messages 240. As such, errors are detected and counteractions can be applied to accumulating hard errors in inactive memory regions, to single event upsets, to soft errors, and to other detected errors. Depending on the safety requirements for a particular solution, the warnings or other error indications through messages 240 can result in flagging the system as unreliable, generating a system reset, generating a system reboot, outputting a warning message, initiating a system shutdown, or other action.

Further, it is noted that the disclosed embodiments provide word-based TMBIST processing as compared to the prior TMBIST processing described above with respect to FIG. 1B (Prior Art). For this prior solution, each n-bit wide data word in memory is modified and re-written n times during each march. In contrast, for the disclosed embodiments using a word-based approach, only one modification is required for each data word 231 in memory 230 for in each march. As such, the overhead with respect to execution time and power consumption is greatly reduced as compared to the prior solution.

Still further, it is noted that prior solutions execute all TMBIST marches directly one after each other without gaps as described below with respect to FIG. 3 (Prior Art). In contrast, the disclosed embodiments preferably distribute the marches 206 over the allotted run time for one TMBIST run as described below with respect to FIG. 4. This distributed marching provides advantages over the non-distributed marches of prior solutions. For example, the distributed marching tends to reverse performance degradations due to BTI. Further, the distributed marching can distribute the memory scrubbing and the related soft-error correction evenly over the allotted run time of one TMBIST run. Although the disclosed embodiments can be implemented without the distributed marching, it is preferred due to these and other potential advantages.

Figure 3:
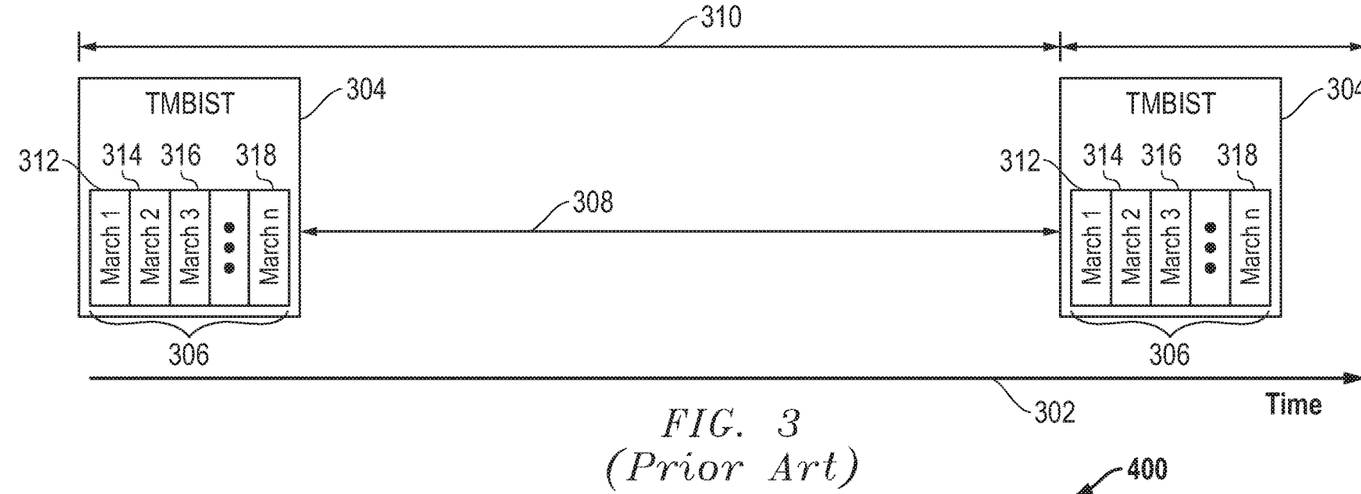
FIG. 3 (Prior Art) is a diagram of an example embodiment for a prior art solution where TMBIST marches are performed directly one after another without time gaps.

FIG. 3 (Prior Art) is a diagram of an example embodiment 300 for a prior solution where TMBIST marches 306 are performed directly one after another without time gaps. The TMBIST runs 304 are performed within a time period 310 with a delay interval 308 between the end of a previous TMBIST run 304 and the next TMBIST run 304. The marches 306 within each TMBIST run 304, however, are performed directly one after another without time gaps. As such, a second march (MARCH 2) 314 begins at the end of the first march (MARCH 1) 312. A third march (MARCH 3) 316 begins at the end of the second (MARCH 2) 314. This continues until an $n^{th}$ march (MARCH n) 318 is completed. This direct and non-distributed processing leaves memory cells of inactive areas in the same logic state for the vast majority of the time as represented by delay interval 308. Further, it is noted that a TMBIST run 304 with several marches 306 might be finished relatively quickly (e.g., 10 to 100 milliseconds) where the delay interval 308 between two TMBIST runs 404 is often in the range of several seconds, minutes or even hours. Leaving inactive memory cells in the same logic state for most of the on-time for a memory bears the risk of degradation due to BTI. This degradation can lead to faults in the memory cells.

Figure 4:
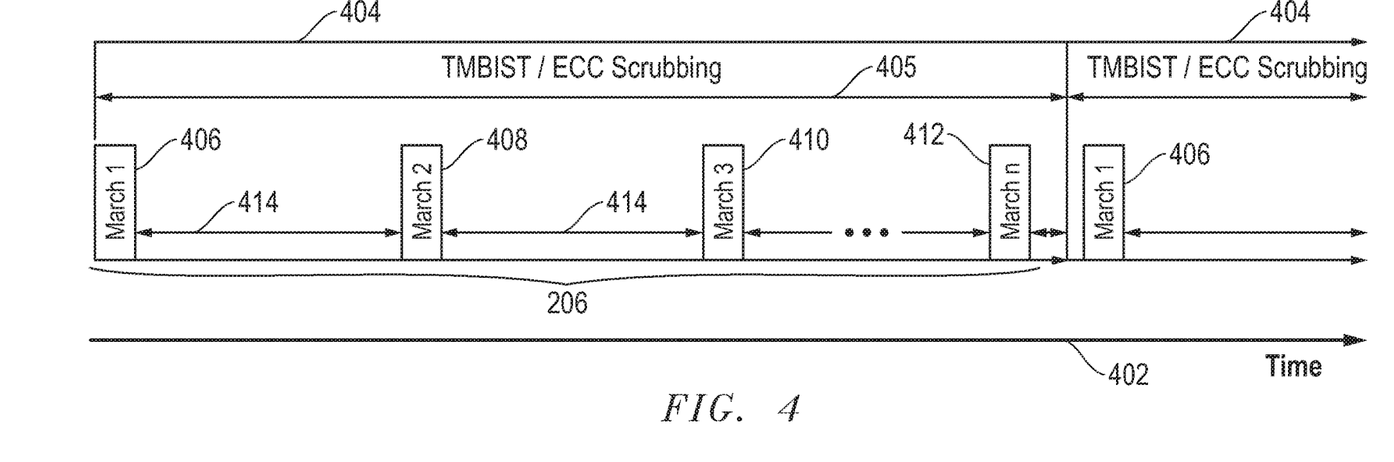
FIG. 4 is a diagram of an example embodiment for distributed marching where TMBIST marches are distributed over the entire allotted run time for each TMBIST run.

FIG. 4 is a diagram of an example embodiment 400 for distributed marching where TMBIST marches 206 are distributed over the entire allotted run time 405 for each TMBIST run 404. The TMBIST runs 404 are performed within the run time 405, and the marches 206 are distributed across this run time 405 with time gaps 414 between each march. As such, a second march (MARCH 2) 408 begins after a time gap 414 from the end of the first march (MARCH 1) 406. A third march (MARCH 3) 408 begins after a time gap 414 from the end of the second (MARCH 2) 408. This continues until an $n^{th}$ march (MARCH n) 412 is completed. Each of the marches 206 will finish relatively quickly (e.g., 2 to 10 milliseconds). In contrast, each time gap 414 is preferably in the range of one or more seconds, one or more minutes, or one or more hours. Further, it is noted that the time gaps 414 between the marches 206 can be made the same so that the marches 206 are evenly spaced and distributed over the whole run time 405. However, one or more different amounts of time can be used for time gaps 414 so that they are not the same and so that the marches 206 are distributed over the whole run time 405 but are not evenly spaced within the whole run time 405. Other timing variations could also be implemented while still using relatively large time gaps 414 between each march within the marches 206. These relatively large time gaps 414 allow for effective reversing of the performance degradation due to BTI that can be suffered in prior solutions as described above with respect to FIGS. 1A-B (Prior Art). This distributed marching provides the further advantage that the scrubbing and resulting ECC-based soft-error correction are distributed, and preferably evenly distributed, over the entire active application mode of the integrated circuit 200 rather than being restricted to the short time of TMBIST runs as shown in FIG. 3 (Prior Art). As such, fault accumulation is counteracted more efficiently.

Figure 5:
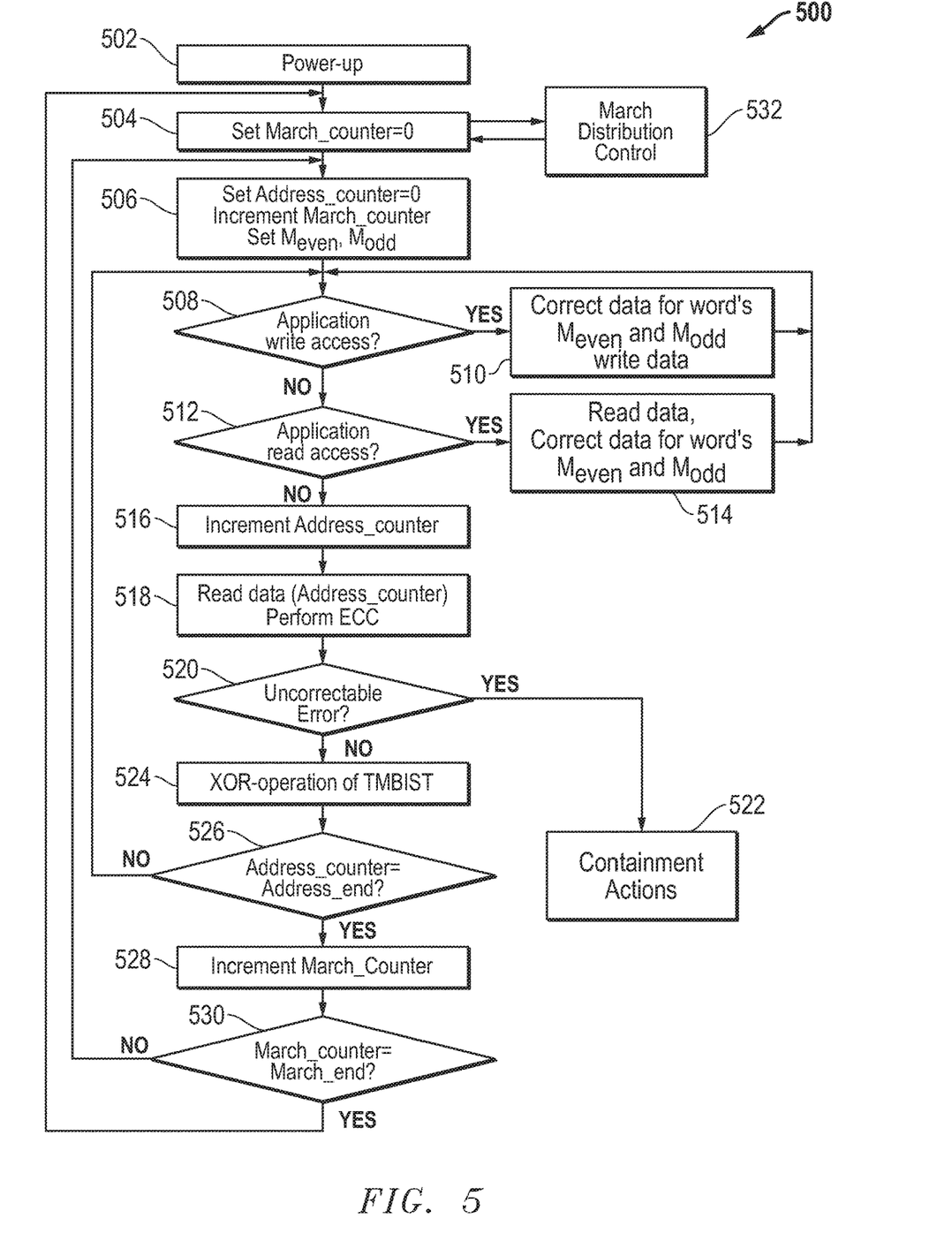
FIG. 5 is a flow diagram of an example embodiment where TMBIST and ECC processes are combined with memory scrubbing to achieve improved memory fault detection and correction.

FIG. 5 is a flow diagram of an example embodiment 500 where TMBIST and ECC processes are combined with memory scrubbing to achieve improved memory fault detection and correction. In block 502, the integrated circuit 200 including the memory system 202 is powered up. In block 504, a march counter 264 is set to an initial state (e.g., address 0). In block 506, an address counter 262 is set to an initial state (e.g., count 0); the march counter is incremented; and the even bit ($M_{even}$) 244 and the odd bit ($M_{odd}$) 245 are set based upon the current march. In block 508, a determination is made whether an application is requesting a write access. If "YES," then flow passes to block 510 where the data is corrected depending upon the current even bit ($M_{even}$) 244 and the odd bit ($M_{odd}$) 245 for the data word 231 being accessed. The data is then written to the data word 231 within the memory 230. If "NO," then flow passes to block 512. In block 512, a determination is made whether the application is requesting a read access. If "YES," then flow passes to block 514 where data is from the data word 231 being accessed within the memory 230. The data is then corrected depending upon the current even bit ($M_{even}$) 244 and the odd bit ($M_{odd}$) 245 for the data word 231 being read from memory 230. If "NO," then flow passes to block 516. Blocks 508 and 512 effectively prioritize accesses to the memory by the application over test accesses by the TMBIST controller 204. If block 516 is reached, then the application is not currently requesting a write access or a read access.

When block 516 is reached, the address counter 262 is incremented. In block 518, ECC data 226 and payload data 228 are read from the data word 231 associated with the address in the address counter 262. The ECC decoder 236 performs an ECC operation to generate a check code that is compared to the ECC data 226 from the data word 231 being read. In block 510, a determination is made whether uncorrectable errors have been detected from this comparison. If "YES," then block 522 is reached where one or more fault containment actions are taken. For example, error messages 240 can be sent to the processor 250 or other destinations to indicate that an uncorrectable error has been detected, and action can be taken in response. If the determination in block 520 is "NO," then block 524 is reached. In block 524, the XOR operations for the current TMBIST march is performed by XOR circuits 220/222 on the data and this XOR'ed data is written to the memory 230. In block 526, a determination is made whether the address counter is at the end of the memory 230 such that the entire memory 230 has been processed. If "NO," then flow passes back to block 508. If "YES," then flow passes to block 528 where the march counter 264 is incremented. In block 530, a determination is made whether the march counter is at the last march such that the TBMIST process has completed. If "NO," then flow passes back to block 506. If "YES," then flow passes back to block 504.

It is noted that the initiation of each march from block 504 is controlled in block 532 so that the marches are distributed across the allotted run time 405 for the TMBIST process. The processor 250 or the controller 204 provides this march distribution control represented by block 532, although other control techniques could also be implemented. It is further noted that different or additional process steps could also be implemented with respect to embodiment 500 while still taking advantage of the techniques described herein.

Looking back to FIG. 2, it is again noted that embodiments can be implemented that do not store the TMBIST data 224 including the even bit ($M_{even}$) 244 and the odd bit ($M_{odd}$) 245 within each data word 231. As described above, the even bit ($M_{even}$) 244 and the odd bit ($M_{odd}$) 245 are used for XOR operations with the data word 231 being written or read. For the additional embodiment of FIG. 6 below, the even bit ($M_{even}$) 244 and the odd bit ($M_{odd}$) 245 for the data word 231 being accessed is not read from the memory 230 but is determined by the TMBIST controller 204 based upon the location of the data being accessed and the state of the TMBIST marches.

Figure 6:
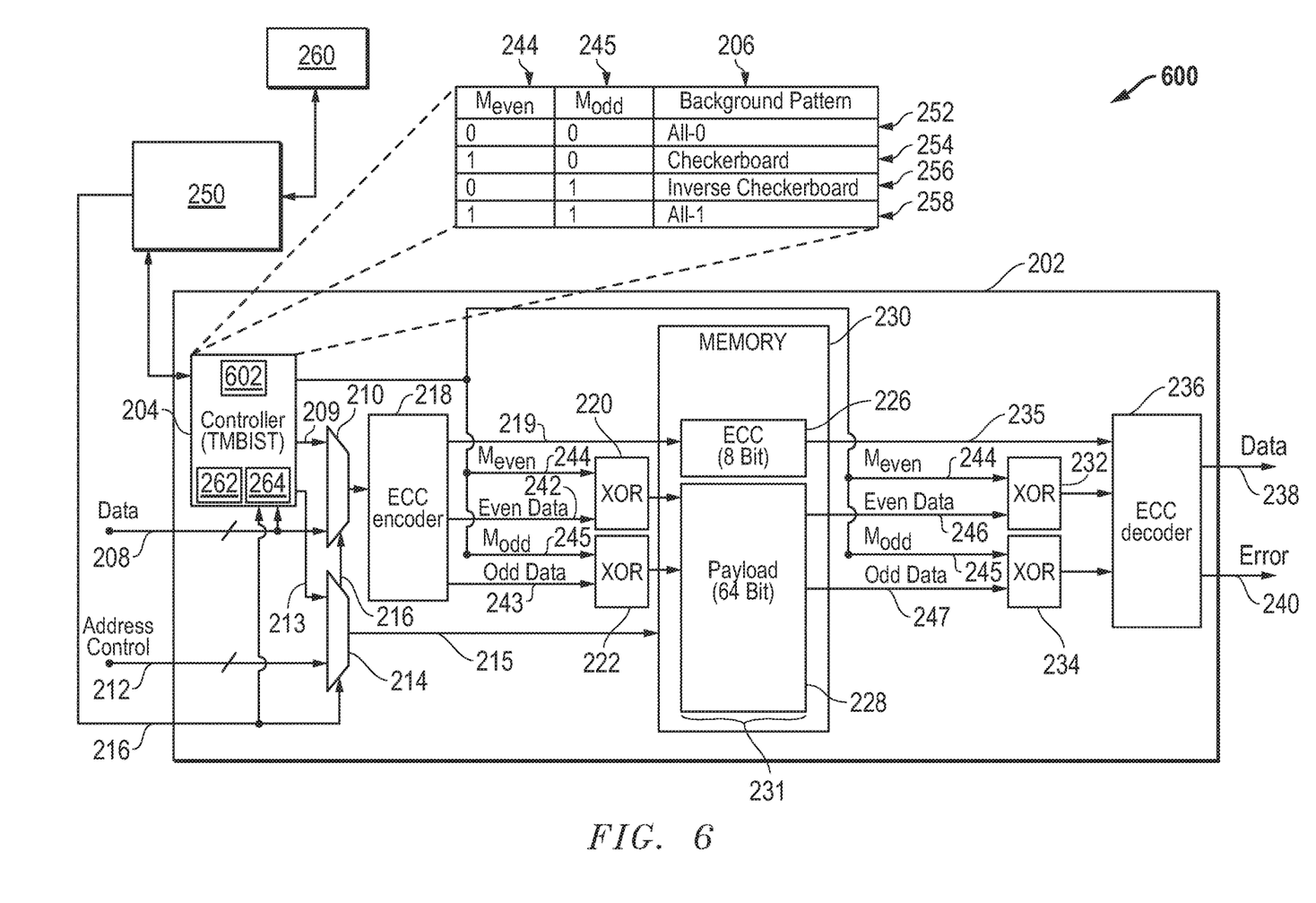
FIG. 6 is a block diagram of an example embodiment for an integrated circuit similar to FIG. 2 except that the TMBIST controller determines the even bit ($M_{even}$) and the odd bit ($M_{odd}$) used in XOR operations for each access.

FIG. 6 is a block diagram of an example embodiment for an integrated circuit 600 similar to integrated circuit 200 of FIG. 2 except that the TMBIST controller 204 determines the even bit ($M_{even}$) 244 and the odd bit ($M_{odd}$) 245 for each access. The embodiment of FIG. 6 is the same as the embodiment of FIG. 2 except that the TMBIST data 224 is not stored with each data word 231, and the controller 204 includes a logic engine 602 to determine the even bit ($M_{even}$) 244 and the odd bit ($M_{odd}$) 245 for each data word 231 being accessed. One advantage of the embodiment of FIG. 6 is that the memory 230 does not need to store the additional TMBIST data 224. In addition, read accesses by the processor 250 are faster because the even bit ($M_{even}$) 244 and the odd bit ($M_{odd}$) 245 are not read from the memory 230.

During each of the marches 206, the even bit ($M_{even}$) 244 and the odd bit ($M_{odd}$) 245 will change as soon as the data word 231 is addressed in the current march. Thus, where an application access request has occurred, it is important to know if the address of the data word 231 requested is before or after the address within address counter 262 for of the TMBIST controller 204. It is noted that "before" and "after" depend upon the direction of incrementing or decrementing the TMBIST address within the address counter 262 in the current march. The logic engine 602 makes the before/after determination by comparing the address of the data word 231 being accessed by the application with the address value within the address counter 262. Further, the logic engine 602 can take into account the direction of the TMBIST address counter 262 in the current march when making this comparison. For the calculation of the even bit ($M_{even}$) 244 and the odd bit ($M_{odd}$) 245, the logic engine 602 determines the even bit ($M_{even}$) 244 and the odd bit ($M_{odd}$) 245 for the backgrounds of all previously completed marches for a particular memory cell, the direction of the address counter in the current march, and the relation of the address counter 262 with respect to the address requested by the processor 250.

Figure 7A:
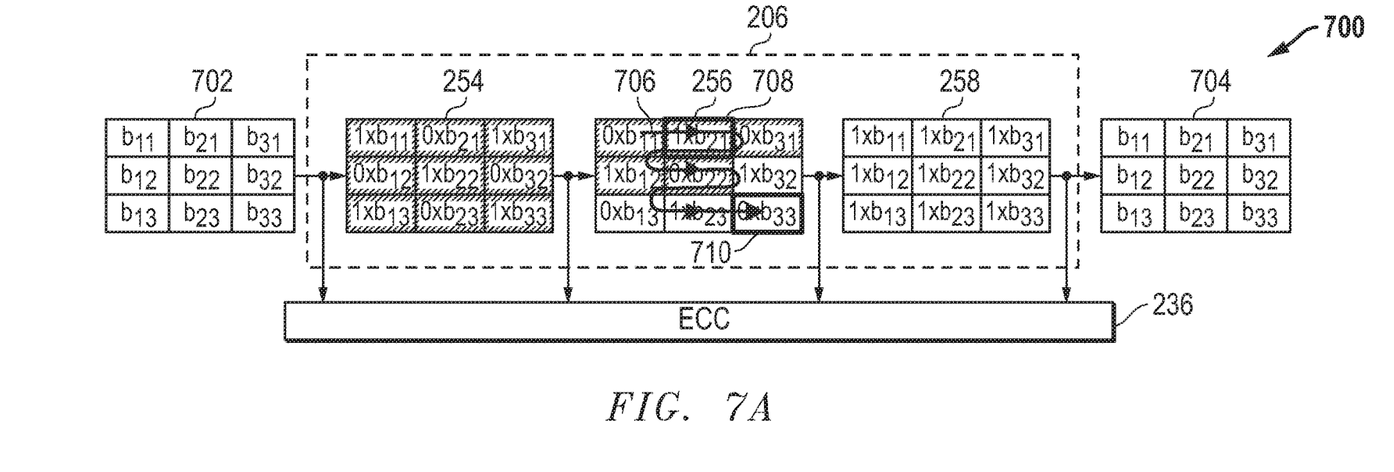
FIG. 7A provides an example embodiment where increasing addresses are used for the TMBIST marches of FIG. 6.

FIG. 7A provides an example embodiment 700 where increasing addresses are used for the TMBIST marches 206 of FIG. 6. The memory cells are designated b11, b12, b13, b21, b22, b23, b31, b32, and b33 and have an initial state 702. It is again noted that the "xy" numbers in the "bxy" designations used herein represent row and column numbers for the location of the cell in a cell array that makes up the memory. The first march 252 from FIG. 6 is not shown. For the second march 254, a checkerboard pattern is used with the even bit ($M_{even}$) 244 set to 1 and the odd bit ($M_{odd}$) 245 set to 0. For the third march 256, an inverse checkerboard pattern is used with the even bit ($M_{even}$) 244 set to 0 and the odd bit ($M_{odd}$) 245 set to 1. For the last march 258, an all-1 pattern is used with the even bit ($M_{even}$) 244 set to 1 and the odd bit ($M_{odd}$) 245 set to 1. For each of the marches 254, 256, and 258, the current memory cell contents are XOR'ed with the even bit ($M_{even}$) 244 and the odd bit ($M_{odd}$) 245 for that march as represented by the "x" between the 1s and 0s and memory contents. The result of the XOR operation is written to each cell. After finishing all marches 206 of a TMBIST run, each memory cell has been inverted an even number of times and is therefore restored to its original state as shown in the final state 704. Before and during these marches 206, the contents of the memory cells are subjected to error checking and correction through the ECC decoder 236 as described above.

For embodiment 700, it is assumed that the second march 254 has been completed, and the TMBIST process is in the middle of the third march 256. This third march 256 is implemented with an increasing address as represented by the direction of the arrows in line 706. It is assumed that cells $b_{11}$ . . . $b_{22}$ have already been XOR'ed and that cells $b_{32}$ . . . $b_{33}$ have not yet been XOR'ed for the third march 256. As such, these cells will have different values for the even bit ($M_{even}$) 244 and the odd bit ($M_{odd}$) 245. In particular, cells associated with higher addresses than the current address in the address counter 262 will not have been processed by the current march. For example, the even bit ($M_{even}$) 244 and the odd bit ($M_{odd}$) 245 for cell ($b_{21}$) 708 is determined from the backgrounds of the second march 254 and the third march 256. In contrast, the even bit ($M_{even}$) 244 and the odd bit ($M_{odd}$) 245 for cell ($b_{33}$) 720 are determined from the background of only the second march 254. Thus, the even bit ($M_{even}$) 244 and the odd bit ($M_{odd}$) 245 for cells in any particular data word 231 are determined based upon the marches that have been completed or not completed with respect to the data word 231 being processed.

Figure 7B:
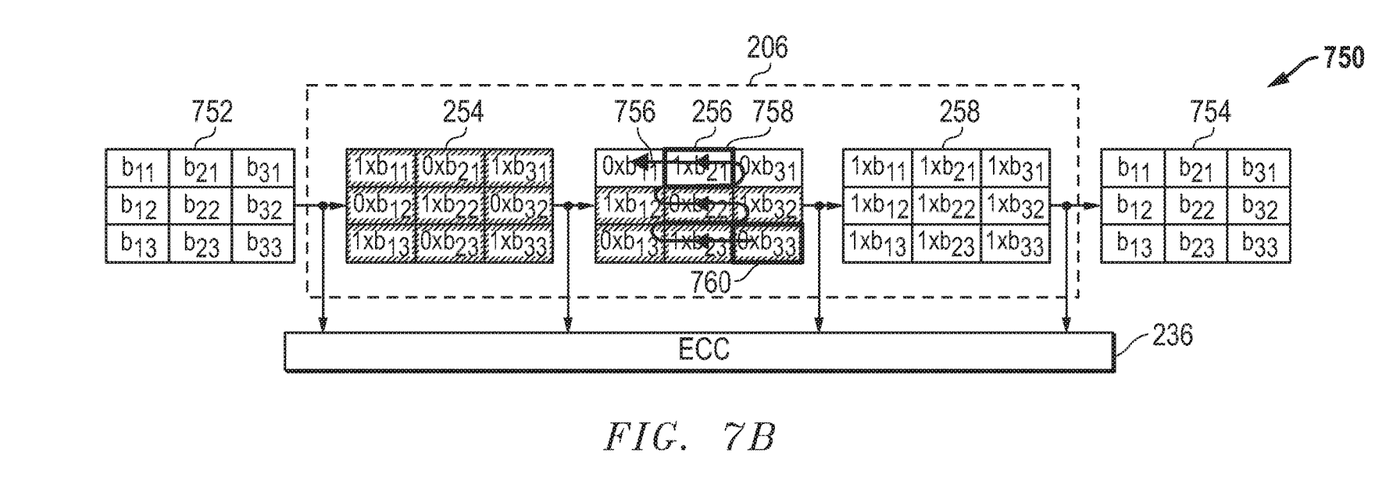
FIG. 7B provides an example embodiment that is the same as embodiment in FIG. 7A except that decreasing addresses are used for the TMBIST marches.

FIG. 7B provides an example embodiment 750 that is the same as embodiment 700 in FIG. 7A except that decreasing addresses are used for one of the TMBIST marches 206. For embodiment 750, it is again assumed that the second march 254 has been completed, and the TMBIST process is in the middle of the third march 256. This third march 256 is implemented with a decreasing address as represented by the direction of the arrows in line 756. It is assumed that cells $b_{11} \ldots b_{31}$ have not yet been XOR'ed and that cells $b_{21} \ldots b_{33}$ have been XOR'ed for the third march 256. As such, these cells will have different values for the even bit ($M_{even}$) 244 and the odd bit ($M_{odd}$) 245. In particular, cells associated with lower addresses than the current address in the address counter 262 will not have been processed by the current march. For example, the even bit ($M_{even}$) 244 and the odd bit ($M_{odd}$) 245 for cell ($b_{21}$) 758 is determined from the background of only the second march 254. In contrast, the even bit ($M_{even}$) 244 and the odd bit ($M_{odd}$) 245 for cell ($b_{33}$) 760 is determined from the backgrounds of both the second march 254 and the third march 256. Thus, the even bit ($M_{even}$) 244 and the odd bit ($M_{odd}$) 245 for cells in any particular data word 231 are determined based upon the marches that have been completed or not completed with respect to the data word 231 being processed.

As described herein, a variety of embodiments can be implemented and different features and variations can be implemented, as desired.

For one embodiment, a system within an integrated circuit is disclosed including a memory, an ECC encoder, input XOR circuits, output XOR circuits, an ECC decoder, a controller, and a processor. The memory has a plurality of data words, and each data word includes payload data and error correction code (ECC) data. The ECC encoder is coupled to receive input data and to provide the ECC data to the memory for each data word, and the ECC data is based upon the input data. The input XOR circuits are coupled to receive the input data from the ECC encoder and to output XOR'ed data as the payload data to the memory. The output XOR circuits are coupled to receive the payload data from the memory and to output XOR'ed data. The ECC decoder is coupled to receive the ECC data from the memory and the XOR'ed data from the output XOR circuits, and the ECC decoder has output data and error messages as an output. The controller is configured to run a transparent memory built-in self-test (TMBIST) process and having test data and test address and control signals as outputs. The processor is configured to execute an application to generate application data and application address and control signals. The system also includes a first multiplexer circuit coupled to select either the test data or the application data to provide as the input data to the ECC encoder, and a second multiplexer circuit coupled to select either the test address and control signals or the application address and control signals to provide to the memory. Further, access to the memory is provided to the processor and the controller during active operation of the application executed by the processor, and the controller is configured to use the TMBIST process to test the memory during the active operation of the application.

In additional embodiments, the test address and control signals and the application address and control signals are configured to determine a data word to be accessed within the memory.

In additional embodiments, the TMBIST process includes a plurality of marches with each march including a pattern to XOR with contents of cells within the memory. In further embodiments, the pattern for each march includes an even bit for XOR operations with even cells in the memory and an odd bit for XOR operations with odd cells in the memory. In still further embodiments, the even bit and the odd bit for a current march are stored with each data word that is accessed. In other further embodiments, the even bit and the odd bit are determined by the controller when each data word is accessed. In further embodiments, the marches include at least one march having a checkerboard pattern, at least one march having an inverse checkerboard pattern, and at least on march having all 1s.

In additional embodiments, the marches are distributed over a run time for the TMBIST process with time gaps between the marches. In further embodiments, each march takes 2 to 10 milliseconds and the run time is one or more seconds. In further embodiments, the marches are distributed evenly over the run time for the TMBIST process.

In additional embodiments, the error messages are based upon comparisons of the ECC data from the memory with check codes generated by the ECC decoder from the payload data from the memory. In further embodiments, the error messages include at least one of detection of an uncorrectable error or detection of a correctable error.

For one embodiment, a method for an integrated circuit is disclosed including storing a plurality of data words in a memory with each data word including payload data and error correction code (ECC) data, receiving input data with an ECC encoder and outputting the ECC data to the memory for each data word with the ECC data being based upon the input data, performing with input XOR circuits an XOR operation on the input data from the ECC encoder and outputting the XOR'ed data as payload data to the memory, performing with output XOR circuits an XOR operation on the payload data from the memory and outputting XOR'ed data, and receiving the XOR'ed data from the output XOR circuits and the ECC data from the memory with an ECC decoder and outputting output data and error messages. The method also includes running a transparent memory built-in self-test (TMBIST) process with a controller and generating test data and test address and control signals as outputs, and executing an application with a processor and generating application data and application address and control signals. Further, the method includes selecting with a first multiplexer either the test data or the application data to provide as the input data to the ECC encoder, and selecting with a second multiplexer circuit either the test address and control signals or the application address and control signals to provide to the memory. In addition, the method includes allowing access to the memory by the processor and the controller during active operation of the application executed by the processor, and testing the memory with the TMBIST process during the active operation of the application.

In additional embodiments, the TMBIST process includes a plurality of marches where each march includes a pattern to XOR with contents of cells within the memory, an even bit for XOR operations with even cells in the memory, an odd bit for XOR operations with odd cells in the memory. In further embodiments, the method includes storing the even bit and the odd bit for a current march with each data word that is accessed. In other further embodiments, the method includes determining with the controller the even bit and the odd bit when each data word is accessed.

In additional embodiments, the marches include at least one march having a checkerboard pattern, at least one march having an inverse checkerboard pattern, and at least on march having all 1s.

In additional embodiments, the marches are distributed over a run time for the TMBIST process. In other additional embodiments, the marches are distributed evenly over the run time for the TMBIST process.

In additional embodiments, the method includes generating check codes with the ECC decoder from payload data for data words and generating the error messages based upon comparisons of the ECC data from the memory with the check codes.

It is further noted that the functional blocks, components, systems, devices, or circuitry described herein can be implemented using hardware, software, or a combination of hardware and software along with analog circuitry as needed. For example, the disclosed embodiments can be implemented using one or more programmed integrated circuits that are programmed to perform the functions, tasks, methods, actions, or other operational features described herein for the disclosed embodiments. The one or more programmed integrated circuits can include, for example, one or more processors or configurable logic devices (CLDs) or a combination thereof. The one or more processors can be, for example, one or more central processing units (CPUs), controllers, microcontrollers, microprocessors, hardware accelerators, ASICs (application specific integrated circuit), or other integrated processing devices. The one or more CLDs can be, for example, one or more CPLDs (complex programmable logic devices), FPGAs (field programmable gate arrays), PLAs (programmable logic array), reconfigurable logic circuits, or other integrated logic devices. Further, the programmed integrated circuits, including the one or more processors, can be programmed to execute software, firmware, code, or other program instructions that are embodied in one or more non-transitory tangible computer-readable mediums to perform the functions, tasks, methods, actions, or other operational features described herein for the disclosed embodiments. The programmed integrated circuits, including the one or more CLDs, can also be programmed using logic code, logic definitions, hardware description languages, configuration files, or other logic instructions that are embodied in one or more non-transitory tangible computer-readable mediums to perform the functions, tasks, methods, actions, or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, or any other non-transitory tangible computer-readable mediums. Other variations can also be implemented while still taking advantage of the techniques described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A system within an integrated circuit, comprising:
a memory having a plurality of data words, each data word comprising payload data and error correction code (ECC) data;
an ECC encoder coupled to receive input data and to provide the ECC data to the memory for each data word, the ECC data being based upon the input data, the ECC providing output data;
input XOR circuits coupled to receive output data from the ECC encoder and perform XOR operations on the output data from the ECC encoder to produce XOR'ed input data as a result of the XOR operations and to output the XOR'ed input data as the payload data to the memory, wherein the input XOR circuits include a first plurality of input XOR circuits and a second plurality of input XOR circuits, wherein the first plurality of input XOR circuits includes a first bit input, wherein the first plurality of input XOR circuits perform XOR operations on the output data from the ECC with a bit from the first bit input to produce bits of the payload data that are stored in a first group of cells of the memory such that each produced bit of the payload data that is stored in the first group of cells is produced with an XOR operation of a bit from the first bit input, wherein the second plurality of input XOR circuits include a second bit input, wherein the second plurality of input XOR circuits perform XOR operations on output data from the ECC with a bit received from the second bit input to produce bits of the payload data that are stored in a second group of cells of the memory such that each produced bit of the payload data that is stored in the second group of cells is produced with an XOR operation of a bit from the second bit input, wherein a bit from the first bit input and a bit from the second bit input are individually controllable with respect to each other;
output XOR circuits coupled to receive the payload data from the memory and bits from additional bit inputs and perform XOR operations on the payload data from the memory with bits received from the additional bit inputs to produce XOR'ed output data as a result of the XOR operations and to output the XOR'ed output data;
an ECC decoder coupled to receive the ECC data from the memory and the XOR'ed output data from the output XOR circuits, the ECC decoder having output data and error messages as an output;
a controller configured to run a transparent memory built-in self-test (TMBIST) process and having test data and test address and control signals as outputs;

a processor configured to execute an application to generate application data and application address and control signals; and a first multiplexer circuit coupled to select either the test data or the application data to provide as the input data to the ECC encoder;

a second multiplexer circuit coupled to select either the test address and control signals or the application address and control signals to provide to the memory;

wherein access to the memory is provided to the processor and the controller during active operation of the application executed by the processor; and wherein the controller is configured to use the TMBIST process to test the memory during the active operation of the application.

2. The system of claim 1, wherein the test address and control signals and the application address and control signals are configured to determine a data word to be accessed within the memory.

3. The system of claim 1, wherein the TMBIST process comprises a plurality of marches, each march comprising a pattern to XOR with contents of cells within the memory by the input XOR circuits and the output XOR circuits.

4. The system of claim 3, wherein the pattern for each march includes an even bit for XOR operations with even cells in the memory and an odd bit for XOR operations with odd cells in the memory, wherein the even bit is provided to the first bit input and the odd bit is provided to the second bit input, wherein the even bit is provided to a first additional bit input of the additional bit inputs and the odd bit is provided to a second additional input of the additional bit inputs.

5. The system of claim 4, wherein the even bit and the odd bit for a current march are stored with each data word that is accessed.

6. The system of claim 4, wherein the even bit and the odd bit are determined by the controller when each data word is accessed.

7. The system of claim 3, wherein the marches comprise at least one march having a checkerboard pattern, at least one march having an inverse checkerboard pattern, and at least one march having all 1s.

8. The system of claim 3, wherein the marches are distributed over a run time for the TMBIST process with time gaps between the marches.

9. The system of claim 8, wherein each march takes 2 to 10 milliseconds and the run time is one or more seconds.

10. The system of claim 8, wherein the marches are distributed evenly over the run time for the TMBIST process.

11. The system of claim 1, wherein the error messages are based upon comparisons of the ECC data from the memory with check codes generated by the ECC decoder from the payload data from the memory.

12. The system of claim 11, wherein the error messages comprise at least one of detection of an uncorrectable error or detection of a correctable error.

13. A method for an integrated circuit, comprising:
storing a plurality of data words in a memory, each data word comprising payload data and error correction code (ECC) data;
receiving input data with an ECC encoder and outputting the ECC data to the memory for each data word and outputting output data, the ECC data being based upon the input data;
performing with input XOR circuits an XOR operation on output data from the ECC encoder to produce XOR'ed input data as a result of the XOR operation and outputting the XOR'ed input data as payload data to the memory, wherein the input XOR circuits include a first plurality of input XOR circuits and a second plurality of input XOR circuits, wherein the first plurality of input XOR circuits includes a first bit input, wherein the performing with the input XOR circuits includes performing with the first plurality of XOR circuits an XOR operation on the output data from the ECC with a first bit from the first bit input to produce bits of the payload data that are stored in a first group of cells of the memory such that each bit of the payload data that is stored in the first group of cells is produced with an XOR operation of the first bit, wherein the second plurality of input XOR circuits includes a second bit input, wherein the performing with the input XOR circuits includes performing with the second plurality of XOR circuits an XOR operation on the output data from the ECC with a second bit from the second bit input to produce bits of the payload data that are stored in a second group of cells of the memory such that each bit of the payload data that is stored in the second group of cells is produced with an XOR operation of the second bit;

performing with output XOR circuits an XOR operation on the payload data from the memory and with bits from additional bit inputs to produce XOR'ed output data as a result of the XOR operation and outputting XOR'ed output data;

receiving the XOR'ed output data from the output XOR circuits and the ECC data from the memory with an ECC decoder and outputting output data and error messages;

running a transparent memory built-in self-test (TMBIST) process with a controller and generating test data and test address and control signals as outputs;

executing an application with a processor and generating application data and application address and control signals; and selecting with a first multiplexer either the test data or the application data to provide as the input data to the ECC encoder;

selecting with a second multiplexer circuit either the test address and control signals or the application address and control signals to provide to the memory;

allowing access to the memory by the processor and the controller during active operation of the application executed by the processor; and testing the memory with the TMBIST process during the active operation of the application.

14. The method of claim 13, wherein the TMBIST process comprises a plurality of marches, each march comprising a pattern to XOR with contents of cells within the memory, an even bit for XOR operations with even cells in the memory, and an odd bit for XOR operations with odd cells in the memory, wherein the even bit is the first bit and the odd bit is the second bit, wherein the even bit is provided on a first additional bit input of the additional bit inputs and the odd bit is provided on a second additional bit input of the additional bit inputs.

15. The method of claim 14, further comprising storing the even bit and the odd bit for a current march with each data word that is accessed.

16. The method of claim 14, further comprising determining with the controller the even bit and the odd bit when each data word is accessed.

17. The method of claim 14, wherein the marches comprise at least one march having a checkerboard pattern, at least one march having an inverse checkerboard pattern, and at least one march having all 1s.

18. The method of claim 14, wherein the marches are distributed over a run time for the TMBIST process.

19. The method of claim 14, wherein the marches are distributed evenly over the run time for the TMBIST process.

20. The method of claim 13, further comprising generating check codes with the ECC decoder from payload data for data words and generating the error messages based upon comparisons of the ECC data from the memory with the check codes.

21. The system of claim 1 wherein:
the output XOR circuits include a first plurality of output XOR circuits and a second plurality of output XOR circuits;
the first plurality of output XOR circuits includes a third bit input of the additional bit inputs, wherein the first plurality of output XOR circuits perform XOR operations on the payload data from the first group of cells of the memory with a bit from the third bit input to produce a first plurality of bits of the XORed output data such that each produced bit of the first plurality of bits of the XORed output data is produced with an XOR operation of a bit from the third bit input;
the second plurality of output XOR circuits includes a fourth bit input of the additional bit inputs, wherein the second plurality of output XOR circuits perform XOR operations on the payload data from the second group of cells of the memory with a bit from the fourth bit input to produce a second plurality of bits of the XORed output data such that each produced bit of the second plurality of bits of the XORed output data is produced with an XOR operation of a bit from the fourth bit input.

22. The system of claim 1 wherein the first group of cells of the memory are even cells of the memory and the second group of cells of the memory are odd cells of the memory.

23. The method of claim 13 wherein the first group of cells of the memory are even cells of the memory and the second group of cells of the memory are odd cells of the memory.

24. The method of claim 13 wherein:
the output XOR circuits include a first plurality of output XOR circuits and a second plurality of output XOR circuits;
the first plurality of output XOR circuits includes a third bit input of the additional bit inputs, wherein the performing with the output XOR circuits an XOR operation includes the first plurality of output XOR circuits performing an XOR operation on the payload data from the first group of cells of the memory with a first bit from the third bit input to produce a first plurality of bits of the XORed output data such that each produced bit of the first plurality of bits of the XORed output data is produced with an XOR operation of the first bit;
the second plurality of output XOR circuits includes a fourth bit input of the additional bit inputs, wherein the performing with the output XOR circuits an XOR operation includes the second plurality of output XOR circuits performing an XOR operation on the payload data from the second group of cells of the memory with a second bit from the fourth bit input to produce a second plurality of bits of the XORed output data such that each produced bit of the second plurality of bits of the XORed output data is produced with an XOR operation of the second bit.

* * * * *